US012589542B2

(12) United States Patent (10) Patent No.: US 12,589,542 B2
Schramm et al. (45) Date of Patent: Mar. 31, 2026

(54) DEVICE AND COMPUTER-IMPLEMENTED METHOD FOR CONTROLLING AN EXTRUSION PLANT, EXTRUSION PLANT, AND COMPUTER-READABLE STORAGE MEDIUM

(71) Applicant: Continental Reifen Deutschland GmbH, Hannover (DE)

(72) Inventors: Oliver Schramm, Harsum (DE); Christian Kunze, Hannover (DE); David Koll, Göttingen (DE)

(73) Assignee: Continental Reifen Deutschland GmbH, Hannover (DE)

( * ) Notice: Subject to any disclaimer, the term of this patent is extended or adjusted under 35 U.S.C. 154(b) by 69 days.

(21) Appl. No.: 18/833,192

(22) PCT Filed: Jan. 4, 2023

(86) PCT No.: PCT/DE2023/200000
§ 371 (c)(1),
(2) Date: Jul. 25, 2024

(87) PCT Pub. No.: WO2023/143675
PCT Pub. Date: Aug. 3, 2023

(65) Prior Publication Data
US 2025/0153416 A1 May 15, 2025

(30) Foreign Application Priority Data
Jan. 25, 2022 (DE) ..................... 10 2022 200 817.0

(51) Int. Cl.
B29C 48/92 (2019.01)
B29C 48/18 (2019.01)
G06F 30/27 (2020.01)

(52) U.S. Cl.
CPC .............. *B29C 48/92* (2019.02); *B29C 48/18* (2019.02); *G06F 30/27* (2020.01); *B29C 2948/9218* (2019.02)

(58) Field of Classification Search
CPC ........................... B29C 64/118; B29C 64/209
See application file for complete search history.

(56) References Cited

U.S. PATENT DOCUMENTS 4,425,289 A 1/1984 Lee et al.
2018/0341248 A1* 11/2018 Mehr ...................... B22F 10/00
(Continued)

FOREIGN PATENT DOCUMENTS

EP 0011355 A1 5/1980
EP 1201397 A2 5/2002
JP 2018039122 A * 3/2018 ............. B29B 7/726

OTHER PUBLICATIONS

International Search Report dated Apr. 28, 2023 of International Application PCT/DE2023/200000 on which this application is based.

*Primary Examiner* — Yung-Sheng M Tsui
(74) *Attorney, Agent, or Firm* — Richard A. Wolf; Gregory Adams

(57) ABSTRACT
A simulated cold extrudate profile, which defines a profile of an extrudate in a cooled state, by a cold profile modeling unit, the determination of a deviation of the cold extrudate profile from a specified extrudate profile by means of a comparison unit and an optimization, based on the deviation, of the process parameters by means of a parameter determining unit, in such a way that a deviation of a cold extrudate profile that is produced from the extrudate profile that is specified becomes small.

14 Claims, 4 Drawing Sheets

(56) References Cited

U.S. PATENT DOCUMENTS

| | | | |
|---|---|---|---|
| 2019/0054700 A1* | 2/2019 | Chandar | G06F 17/18 |
| 2020/0368970 A1* | 11/2020 | Georgeson | B33Y 10/00 |
| 2022/0143743 A1* | 5/2022 | Riemann | B23K 26/342 |
| 2023/0256680 A1* | 8/2023 | De Samber | B33Y 30/00 |
| | | | 264/40.1 |

* cited by examiner

DEVICE AND COMPUTER-IMPLEMENTED METHOD FOR CONTROLLING AN EXTRUSION PLANT, EXTRUSION PLANT, AND COMPUTER-READABLE STORAGE MEDIUM

CROSS-REFERENCE TO RELATED APPLICATIONS

The present application is a National Stage Application under 35 U.S.C. § 371 of International Patent Application No. PCT/DE2023/200000 filed on Jan. 4, 2023, and claims priority from German Patent Application No. 10 2022 200 817.0 filed on Jan. 25, 2022, in the German Patent and Trademark Office, the disclosures of which are herein incorporated by reference in their entireties.

BRIEF SUMMARY

The present invention relates generally to an apparatus and a computer-implemented method for controlling an extrusion installation having at least one extrusion head, to an extrusion installation and to a computer-readable storage medium.

Extrusion installations are known from the prior art. They are used, for example, to produce tires for the production of extrudates in the form of semifinished products, for example sidewalls, treads, etc. Extrusion installations play an extremely important part in particular in improving the quality of tires.

A tire consists of a plurality of regions, such as the tread, the sidewall and the shoulder strip. In addition, each of these regions consists of a plurality of rubber segments having different properties, so that the tire can be optimized in respect of tire properties such as low rolling resistance, high mileage, good braking performance and low noise emission. How well the desired tire properties are achieved depends substantially on how accurately the tire profile can be produced.

A method is known in which an extrusion installation is used to produce a plurality of rubber regions as one component. By means of an extrusion installation, any desired number, depending on the number of extruders that open into an extrusion region, of extrudates of different material mixtures can be joined together in one operation to form a common extrudate, for example a tread component. For example, material mixtures such as natural rubber, synthetic rubber, electrically conductive segments such as silica mixtures can be used.

By means of a hopper, material is fed by a screw to an intake region of an extruder. While the material is being transported by the screw in the direction toward an extrusion head, the material is plasticized and the temperature thereof is adjusted by heating/cooling elements. The warm material is pressed through flow channels in the extrusion head and out of a shaping opening (a mold) onto a conveying apparatus. The material is here subjected to in some cases extreme material deviations, for example from the round diameter from the screw zone to a, for example, rectangular flat profile shape. The shaped mass is referred to as the extrudate.

By means of uniform feeding and a special screw geometry, a high and uniform degree of filling and thus a constant pulsation-free output with a high throughput is achieved. The screw diameters here vary from about 45-350 millimeters with maximum outputs of 120-7000 kg/h.

The finished extrudates can have a plurality of different components. The shape of the individual components of the extrudate (with different mixtures) and of the extrudate as a whole is dependent on process, material and machine parameters. Machine and process parameters can be, for example, the extrusion speed, the material mixture of the components, the pressure in the flow channel of the extrusion head, the temperature in the barrel around the screw and in the flow channel of the extrusion head, the rotational speed of the screw, the geometry of the flow channel in the extrusion head and further parameters. In order to meet the quality and performance requirements in respect of the geometry of the extrudate, it is necessary to control the various influencing parameters as accurately as possible. It is known that the extrusion installation can be controlled manually and/or automatically.

In automatic control systems known hitherto, the extrusion speed or the speed at which the extrudate is transported by means of a conveying apparatus is varied during operation on the basis of measured geometric data of a warm or cold extrusion profile. However, this method has the disadvantage that the extrudate profile is not measured in the warm or cold state until 5-12 m or even up to 100 m after an outlet side of the extrusion head.

If the profile of the cold extrudate deviates from a specified profile, the parameters are thus adjusted only with a time delay. Therefore, over a process period which is dependent on the speed of detection of and reaction to incorrect process parameters, an "extrudate that does not conform to specifications", which does not meet, or meets only inadequately, the quality and performance requirements that have been made, can be produced. This extrudate cannot be used for further processing and is separated from the remainder of the extrudate and disposed of. In addition, in particular during the speeding up of the apparatus which is subsequently necessary, a quantity of material that does not conform is produced and must likewise be discarded after passing through the apparatus.

Proceeding from this prior art, it is an object of the present invention to overcome the mentioned disadvantages. In particular, it is an object of the invention to improve the quality and the efficiency of the extrusion process. It is further a particular object of the invention to reduce the rejects during extrusion.

DETAILED DESCRIPTION

This object is achieved by an apparatus, by a computer-implemented method for controlling an extrusion installation, by an extrusion installation and by a computer-readable storage medium.

In particular, the object is achieved by an apparatus for controlling an extrusion installation having at least one extrusion head for shaping at least one extrudate, which apparatus has the following:

a profile determining unit which is configured to determine, in particular at least substantially contactlessly, a warm extrudate profile of at least one extrudate, wherein the warm extrudate profile defines geometric data of the extrudate in a warm state, a first cold profile modeling unit which is configured, on the basis of the warm extrudate profile and initial process parameters, to parameterize an extrudate model which determines a first cold extrudate profile of the extrudate in a cooled state, a comparison unit which is configured to determine a first deviation between the determined first cold extrudate profile and a specified extrudate profile, a parameter determining unit which is configured, using the first deviation, to optimize process parameters and to determine changed process parameters, such that a deviation of a cold extrudate profile that is produced from the specified extrudate profile becomes small, a selecting unit which is configured to select the changed process parameters as the input for the actuating unit if the deviation is less than or equal to a threshold value, and an actuating unit which is configured to control the extrusion installation with the changed process parameters, in particular in order to produce a second warm extrudate.

By means of the apparatus according to the invention, control of the extrusion installation can be improved and the rejects are reduced. In particular, the use of unsuitable process parameters can quickly be detected and ended. The rejects produced are thus minimized.

The individual units can be in communicative connection with one another. Communicative connection of the units can be established, for example, via an EtherCAT connection, Profibus, Profinet or OPC. A wireless connection between the units can here be preferred. Alternatively, a wired connection between the units can be possible. In particular, a detachable or non-detachable cable connection can be achieved.

The extrusion installation can have a hopper which is configured to hold material which can be transported via a screw along a barrel. Materials can be, for example, natural rubber, synthetic rubber, electrically conductive segments with a high carbon black content, silica mixtures, fillers, plastics and/or further materials. While the material is being transported, it can be warmed via heating elements on the barrel, the screw and the extrusion head, so that it is plasticized and its temperature can be adjusted. The plasticized material can be pressed through flow channels in the extrusion head and out of a shaping opening of the extrusion head onto a conveying apparatus in the form of an extrudate. The conveying apparatus can be, for example, a conveyor belt, a roller conveyor, a robot or any other apparatus suitable for transporting the extrudate. Immediately after shaping of the extrudate, the extrudate is in a warm state and has an extrudate profile that is characteristic of the warm state.

The profile determining unit can be configured to determine a warm extrudate profile of at least one extrudate, wherein the warm extrudate profile can define geometric data of the extrudate in a warm state. Geometric data of an extrudate profile, for example of a warm and/or cold extrudate profile, can include data relating to an overall height, an overall width, a shoulder height, a shoulder width, a total cross-sectional area, at least a partial cross-sectional area and/or a partial layer thickness over at least a partial layer of the extrudate, if the extrudate consists of a plurality of partial layers comprising a plurality of mixture components. The profile determining unit can comprise one, two or more apparatuses which can be arranged to determine the warm and/or the cold extrudate profile of the at least one extrudate in particular contactlessly. At the time of the profile determination, the extrudate can be in a warm state. In this state, the extrudate is still readily moldable. By means of an at least substantially contactless profile determination, it can be avoided that the extrudate is deformed in an adverse manner by the profile determining unit, that is to say a profile determination of the extrudate can be carried out without impairing the extrudate. To this end, the profile determining unit can have visual sensors, in particular laser sensors, ultrasonic sensors, cameras or other sensors for contactless profile determination. In particular, the profile determining unit can be a profilometer. For determining the partial layer thickness over at least a partial layer of the extrudate, a layer thickness determining unit can in particular be provided. The profile determining unit can thus also be formed of a profilometer and a layer thickness determining unit.

The information about the warm extrudate profile can be transmitted to a first cold profile modeling unit. The first cold profile modeling unit is configured, on the basis of the warm extrudate profile and initial process parameters, to parameterize an extrudate model which determines a first cold extrudate profile of the extrudate in a cooled state. In principle, the extrusion installation can be configured to continuously produce an extrudate. In this respect, a first and/or a second extrudate can be a region of the continuously produced extrudate that has been produced with the same process parameters. A first extrudate thus differs from a second extrudate in particular by the process parameters which have been used for its production. Initial process parameters can define process parameters of the extrusion installation which are present during the process of producing the warm extrudate and which influence the warm extrudate profile. Initial process parameters can thus also be referred to as formula parameters, because they can be specified by a formula for production of the extrudate. In addition to the process parameters, the extrudate profile can be influenced by the geometry of the extrusion head and of a shaping mold, by the material mixture and by the extrusion method (pulled extrusion or relaxed extrusion). The parameterization of the extrudate model can be carried out by means of artificial intelligence, in particular neural networks or gradient boosting. In this respect, information about the geometry of the extrusion head and of the shaping mold, the material mixture and the extrusion method can additionally be used for the parameterization of the extrudate model. The first cold extrudate profile of the extrudate in a cooled state can differ from the warm extrudate profile of the extrudate on the basis of the geometric data of the extrudate profile. During production, the extrudate changes from a warm state to a cold state, wherein different extrudate profiles are present in each state.

The information about the first cold extrudate profile of the extrudate in a cooled state is made available to a comparison unit. The comparison unit is configured to determine a first deviation between the first cold extrudate profile and a specified extrudate profile.

The specified extrudate profile can define a cold extrudate profile of an extrudate in a cold state that is to be produced as accurately as possible with the extrusion installation. That is to say, the specified extrudate profile can specify geometric target values of the extrudate. Defined information about the geometry of a cold extrudate profile of an extrudate can be assigned to the specified extrudate profile. The deviation can relate in particular to a deviation of one, a plurality or all of the geometric data of the first cold extrudate profile and of the specified extrudate profile.

The determination of the deviation can comprise a comparison of the first cold extrudate profile and the specified extrudate profile, in particular of the geometric data of the first cold extrudate profile and of the specified extrudate profile.

In the comparison of extrudate profiles, each individual geometric value of a first extrudate profile and of a second extrudate profile can very generally be compared with one another. The results of the comparison represent a deviation between the first extrudate profile and the second extrudate profile in respect of a geometric value. In one embodiment, an extrudate profile can be provided in the form of a vector, wherein the comparison unit can be configured to determine the vector difference of the extrudate profiles as the first deviation. The vector can, for example, provide information about the geometry of the corresponding profile in each dimension, as described above. In the determination of the deviation, a weighted comparison of the first extrudate profile and of the second extrudate profile can further in particular be carried out, wherein one or more geometric values of the extrudate profile are given a higher weighting than one or more other geometric values of the extrudate profile. In this respect, application-specific metrics can be defined. This type of comparison can be used for any comparison of extrudate profiles within the scope of this disclosure, for example between the first cold extrudate profile and the specified extrudate profile. Use of the weighted comparison of geometric values has the advantage that one or more geometric values can be given greater consideration in the overall deviation. In this respect, it is possible to give a greater weighting to geometric values for which a deviation of the finished extrudate from the specified extrudate is more critical, that is to say, for example, is associated with complex post-processing.

The result of the first deviation between the first cold extrudate profile and a specified extrudate profile can be transmitted to a parameter determining unit.

The parameter determining unit is configured, using the first deviation, to optimize process parameters and to determine changed process parameters, such that a deviation of a cold extrudate profile that is produced from the specified extrudate profile becomes small.

Process parameters can be a rotational speed of the screw, a pressure in the flow channel of the extrusion head, a temperature in the barrel around the screw and in the flow channel of the extrusion head and/or further parameters. The parameter determining unit can in particular optimize one or more process parameters. A deviation of the cold extrudate profile that is produced from the specified extrudate profile can be referred to as small if the deviation is less than a defined threshold value. In particular, each individual first deviation between the first cold extrudate profile and a specified extrudate profile is compared with the threshold value in respect of a geometric value. A deviation of the cold extrudate profile that is produced from the specified extrudate profile can therefore be referred to as small if each of the first deviations is less than the defined threshold value. The threshold value can consist in particular of one or more different partial threshold values, wherein a partial threshold value can define the deviation of one or more geometric values of the cold extrudate profile that is produced from one or more geometric values of the specified extrudate profile. One or more partial threshold values can be combined to give a common threshold value. Alternatively, an individual partial threshold value can be used for determining the process parameters. As a result, the threshold value can be defined individually according to requirements. The threshold value can thus likewise be represented as a vector, wherein each vector dimension can define a limit value specified for a geometric datum. It is further conceivable that the parameter determining unit is configured to determine the amount of the threshold value, in order to compare this amount with a threshold value.

The parameter determining unit can be configured to implement the optimization by means of a gradient method, wherein the deviation is minimized. Optimal process parameters can thus be determined in an efficient manner.

The apparatus further has a selecting unit which is configured to select the changed process parameters as the input for the actuating unit, in particular the optimized process parameters, if the deviation is less than or equal to a threshold value. The selecting unit can be in communicative connection with the parameter determining unit, from which it can receive the information about the changed process parameters and can transmit this information to the actuating unit as the input.

The actuating unit is configured, on the basis of the information about the changed process parameters, to control the extrusion installation with the changed process parameters. The actuating unit can in particular control one or more apparatuses of the extrusion installation with the changed process parameters. In particular, the actuating unit can control the rotational speed of the screw and the temperature in the barrel around the screw directly via apparatuses of the extrusion installation. The actuating unit can further control the pressure in the flow channel of the extrusion head, the temperature of the flow channel of the extrusion head and/or further parameters indirectly via apparatuses of the extrusion installation, for example via the rotational speed of the screw.

In one embodiment, the parameter determining unit can further have the following:

a warm profile modeling unit which can be configured to determine a simulated warm extrudate profile on the basis of the changed process parameters and/or the warm extrudate profile, and a second cold profile modeling unit which can be configured to determine a second simulated cold extrudate profile on the basis of the simulated warm extrudate profile and/or the changed process parameters, wherein the comparison unit can further be configured to determine a second deviation between the determined second cold simulated extrudate profile and the specified extrudate profile.

The warm profile modeling unit can be in communicative connection with the parameter determining unit and can be configured to receive information about the changed first process parameters. The warm profile modeling unit can be in communicative connection with the profile determining unit and can be configured to receive information about the warm extrudate profile of the at least one extrudate. On the basis of the changed process parameters and the warm extrudate profile, the warm profile modeling unit can determine a simulated warm extrudate profile. The determination of the simulated warm extrudate profile can include a parameterization of the extrudate model. The parameterization of the extrudate model can in principle be carried out by means of artificial intelligence, in particular neural networks and/or gradient boosting. In this respect, information about the geometry of the extrusion head and of a shaping mold, the material mixture and the extrusion method can additionally be used for the parameterization of the extrudate model, for the determination of a warm extrudate profile and/or of a cold extrudate profile.

The warm profile modeling unit can be configured to transmit information about the simulated warm extrudate profile to a second cold profile modeling unit. The second cold profile modeling unit can be configured to receive information about the changed process parameters from the parameter determining unit. On the basis of the simulated warm extrudate profile and the changed process parameters, the second cold profile modeling unit can be configured to determine a second simulated cold profile. The determination of the second simulated cold extrudate profile can include a parameterization of the extrudate model. The extrusion installation can be so controlled that the warm profile belonging to the specified cold profile is produced, that is to say an extrudate having a warm extrudate profile which, after cooling, has the specified cold profile.

The second cold profile modeling unit can further be configured to transmit information about the second cold extrudate profile of the extrudate to the comparison unit. The comparison unit can further be configured to determine a second deviation between the determined second cold extrudate profile and the specified extrudate profile.

In one embodiment, the warm profile modeling unit and the second cold profile modeling unit can be configured to determine in alternation a warm extrudate profile and then a cold extrudate profile. The comparison unit can thus be configured to determine a deviation of the second cold extrudate profile from the specified extrudate profile after each pass. Using an optimization method, such as, for example, a gradient method, the deviation can be minimized, or optimized, by repeated determination of the warm extrudate profile and the cold extrudate profile.

By using the second cold profile modeling unit and/or the warm profile modeling unit, the optimization of the process parameters can thus be improved further. In particular, the quality of the optimization can be increased by determining the second deviation between the determined second cold extrudate profile and the specified extrudate profile. As a result, the quality of the extrudate that is produced can be improved in that fewer relatively small deviations from specified extrudate properties are achieved. Finally, the amount of extra work on an extrudate that does not conform and the material wastage can be reduced, which results in a higher efficiency of the extrusion installation and a reduced expenditure of time in the production of the extrudate that conforms to specifications.

In one embodiment, the apparatus can have a weight determining unit for determining a warm extrudate weight of the at least one extrudate, in particular on an outlet side of the extrusion head.

The weight determining unit can be arranged in particular less than 40 m, or less than 30 m, or less than 20 m, or less than or equal to 10 m, or more particularly 7-10 m on an outlet side of the extrusion head. The weight determining unit can determine the warm extrudate weight of the at least one extrudate as the weight per unit length, in particular as the weight per meter. The weight determining unit can be a scale or any other apparatus suitable for determining the extrudate weight.

By means of the weight determining unit, information about the extrudate weight can additionally be made available to the first cold profile modeling unit, and the accuracy of the extrudate model can thus be increased.

In one embodiment, the threshold value can correspond to a deviation of less than 5%, less than 3%, less than 2%, less than 1%, preferably less than 0.5%, of the at least first simulated cold extrudate profile from the specified extrudate profile. The threshold value can also relate to any dimension of a vector, so that for each dimension the deviation from the threshold value must be maintained.

The determination of the deviation can comprise a comparison of the first cold extrudate profile and the specific extrudate profile, in particular of the geometric data of the first cold extrudate profile and of the specific extrudate profile.

The deviation can relate in particular to a deviation of one, a plurality or all of the geometric data of the first cold extrudate profile and of the specified extrudate profile.

In one embodiment, the profile determining unit can be configured to determine a second warm extrudate profile for a second warm extrudate and to compare it with the simulated warm extrudate profile, wherein the second cold profile modeling unit can be configured to use the second warm extrudate profile if a deviation between the second warm extrudate profile and the simulated warm extrudate profile is greater than the threshold value, wherein in particular the comparison unit can be configured to determine the deviation.

This has the advantage that, in the case of an inaccurate prediction of the second warm extrudate profile by the simulated warm extrudate profile, the process can be stopped, so that the second warm extrudate profile that is actually measured is then used to determine the cold extrudate profile, or the deviation of the simulated warm profile from the actual warm profile is used as the control variable for the control unit. The second warm extrudate profile and the simulated warm extrudate profile are based on the same process parameters, so that these would have to be identical in the case of an optimal extrudate model. The rejects of the installation can thus be reduced further.

The selecting unit can be configured to be in communicative connection with the parameter determining unit in order to receive the information about the changed process parameters. The selecting unit can be configured to select the changed process parameters if the second deviation is less than or equal to the threshold value and to select the initial process parameters if the second deviation is greater than the threshold value. The selecting unit can be configured to transmit the changed process parameters and/or the initial process parameters to the actuating unit as the input.

The first cold profile modeling unit, the second cold profile modeling unit and/or the warm profile modeling unit can be in the form of modeling units that are separate from one another. In one embodiment, the first cold profile modeling unit, the second cold profile modeling unit and/or the warm profile modeling unit can be in the form of one modeling unit. The first cold profile modeling unit, the second cold profile modeling unit and/or the warm profile modeling unit can be composed of the same components and perform similar functions and/or use similar inputs. The modeling units can be software which is executed by a processor. However, a distributed design in which each modeling unit is executed by a different processor is also possible. It is further conceivable that the components of the apparatus are in the form of hardware, for example by implementing parts of the apparatus on an FPGA or ASIC.

The extrudate in a warm state can differ from an extrudate in the cold state. The extrudate in a warm state can have a higher temperature than the extrudate in a cold state. Furthermore, the extrudate in a warm state can be arranged closer to the outlet side of the extrusion head than the extrudate in a cold state. In one embodiment, the extrudate in a warm state can have a temperature of more than 60° C., or more than 55° C., or more than 50° C. and/or can be arranged on a conveying apparatus at a distance of less than 40 m, or less than 30 m, or less than 20 m, or less than or equal to 10 m on the outlet side of the extrusion head, and/or the extrudate in a cold state can have a temperature of less than or equal to 50° C., or less than 45° C., or less than 40°

C. and/or can be arranged on a conveying apparatus at a distance of more than 80 m, or more than 50 m, or more than 30 m, or more than 10 m on the outlet side of the extrusion head. The transition of the extrudate from the warm state into the cold state depends on the profile, in particular the thickness of the finished extrudate and the thermal conductivity of the material. An extrudate of large thickness has a larger volume, in which heat is stored, than an extrudate of small thickness. The extrudate of large thickness thus takes longer than the extrudate of small thickness to reach a temperature which is in the cold range. The extrudate of large thickness can therefore be transported by the conveying apparatus over a greater distance than the extrudate of small thickness until it reaches the cold state and can accordingly be arranged at a greater distance on an outlet side of the extrusion head. The extrudate of small thickness can have an extrudate thickness of 1-3 mm. The extrudate of large thickness can have an extrudate thickness of 5-30 mm. In the case of an extrudate thickness of 1-3 mm, the cold state can be reached on transport at a distance of less than 10 m from the extrusion head. In the case of an extrudate thickness of 5-30 mm, the cold state can be reached on transport at a distance of greater than 80 m from the extrusion head.

In one embodiment, the determination of the cold extrudate profile and/or the determination of the warm extrudate profile can be carried out by means of artificial intelligence, in particular a neural network, more particularly an LSTM-based system, and/or gradient boosting, or with an analytical or empirical model. That is to say, the various modeling units, or the extrudate model itself, can be in the form of an AI system. For example, the cold profile modeling unit can have or implement a neural network or a gradient boosting-based method. The warm profile modeling units can each implement a time series AI system, for example a gradient boosting system or neural network. In the case of a neural network, for example, a long short-term memory (LSTM)-based system can be used. The AI systems can be trained with training data which are measured in the normal production process. To this end, sensors which measure a warm profile and a corresponding cold profile can be arranged on conventional production lines. These data can then be used as training data.

By means of AI systems, correlations between the warm extrudate profile, the simulated cold extrudate profile and process parameters can be established and evaluated and, on the basis of the evaluation, process parameters can be optimized.

In one embodiment, the apparatus can have a memory which can be configured to store warm and cold extrudate profiles of extrudates that are produced as well as process parameters, in particular at predefined intervals, wherein the cold profile and/or the warm profile modeling units can be configured to train the extrudate model using the stored extrudate profiles.

In addition to an initial collection of training data, further training data can also be collected during normal operation of the extrusion installation. With each process cycle, information for training the model is gathered, so that, as the number of process cycles increases, more information is available. By means of a continuously increasing number of extrudate profiles, the model can continuously be trained and the optimization of the process parameters can be improved further.

The receiving and use of information at predefined intervals describes an iterative process. For example, information is collected over a period of one week, one month or one year and then made available to the cold profile modeling units and/or the warm profile modeling unit.

Thus, by means of the apparatus described herein, control of the extrusion installation can be improved and the rejects can be reduced.

The object mentioned at the beginning is further achieved in particular by a computer-implemented method for controlling an extrusion installation, which method comprises the following steps:

a) determination of a warm extrudate profile of at least one extrudate by means of a profile determining unit, wherein the warm extrudate profile defines geometric data of the extrudate in a warm state, b) parameterization of an extrudate model by means of a first cold profile modeling unit on the basis of the warm extrudate profile and initial process parameters, wherein the extrudate model determines a first cold extrudate profile of the extrudate in a cooled state, c) determination of a first deviation between the determined first cold extrudate profile and a specified extrudate profile by means of a comparison unit, d) optimization of process parameters and determination of changed process parameters using the first deviation by means of a parameter determining unit, such that a deviation of a cold extrudate profile that is produced from the specified extrudate profile becomes small, e) selection of the changed process parameters as the input for an actuating unit of the extrusion installation if the deviation is less than or equal to a threshold value, by means of a selecting unit, and f) control of the extrusion installation with the changed process parameters by means of an actuating unit.

The apparatus described herein can be used in particular using a method described herein for controlling an extrusion installation, or the method can be implemented by the described apparatus. In this respect, the modifications and developments described in respect of the apparatus are also applicable in respect of the method.

In one embodiment, the parameter determining unit can be configured to perform the following steps:

determination of a simulated warm extrudate profile on the basis of the changed process parameters and/or the warm extrudate profile by means of a warm profile modeling unit, and determination of a second simulated extrudate profile on the basis of the simulated warm extrudate profile and the changed process parameters by means of a second cold profile modeling unit, wherein the determination comprises the determination of a second deviation between the second simulated cold extrudate profile and the specified extrudate profile.

In one embodiment, the method can comprise the determination of a warm extrudate weight of the at least one extrudate, in particular by a weight determining unit of the apparatus described above.

The determination of the deviation can comprise a comparison of the first cold extrudate profile and the specified extrudate profile, in particular of the geometric data of the first cold extrudate profile and of the specified extrudate profile.

In one embodiment, the method can comprise the following steps:

determination of a second warm extrudate profile for a second warm extrudate, comparison of the second warm extrudate profile with the simulated warm extrudate profile, in particular by the comparison unit, use of the second warm extrudate profile in the determination of the cold extrudate profile if a deviation between the second warm extrudate profile and the simulated warm extrudate profile is greater than the threshold value.

In one embodiment, the method can comprise transmission of the changed and/or of the initial process parameters to the actuating unit.

In one embodiment, the determination of the cold extrudate profile and/or the simulation of the warm extrudate profile can be carried out by means of artificial intelligence, in particular a neural network or by gradient boosting. Correlations between the warm extrudate profile, the simulated cold extrudate profile and process parameters can thus be established and evaluated and, on the basis of the evaluation, process parameters can be optimized.

Thus, by means of the method described herein, improved control of the extrusion installation can be provided. Similar advantages to those already elucidated in connection with the apparatus are achieved.

The object is further achieved in particular by an extrusion installation, in particular a multiplex extrusion installation, having the following:

an apparatus for controlling an extrusion installation, as has been described above;
at least one extrusion head;
at least one screw;
at least one screw drive;
at least one barrel; and
at least one filling hopper; and/or
at least one material transport unit; and/or
at least one cooling unit.

Similar or identical advantages to those already described in connection with the apparatus described above are achieved.

The object is further achieved in particular by a computer-readable storage medium which contains instructions which cause at least one processor to implement a method as described above when the instructions are executed by the at least one processor.

Similar or identical advantages to those already described in connection with the apparatus described above are achieved.

Further embodiments will be found in the dependent claims.

BRIEF DESCRIPTION OF THE DRAWINGS

The invention is to be elucidated in detail hereinafter by exemplary embodiments. In the drawings.

DETAILED DESCRIPTION

Figure 1:
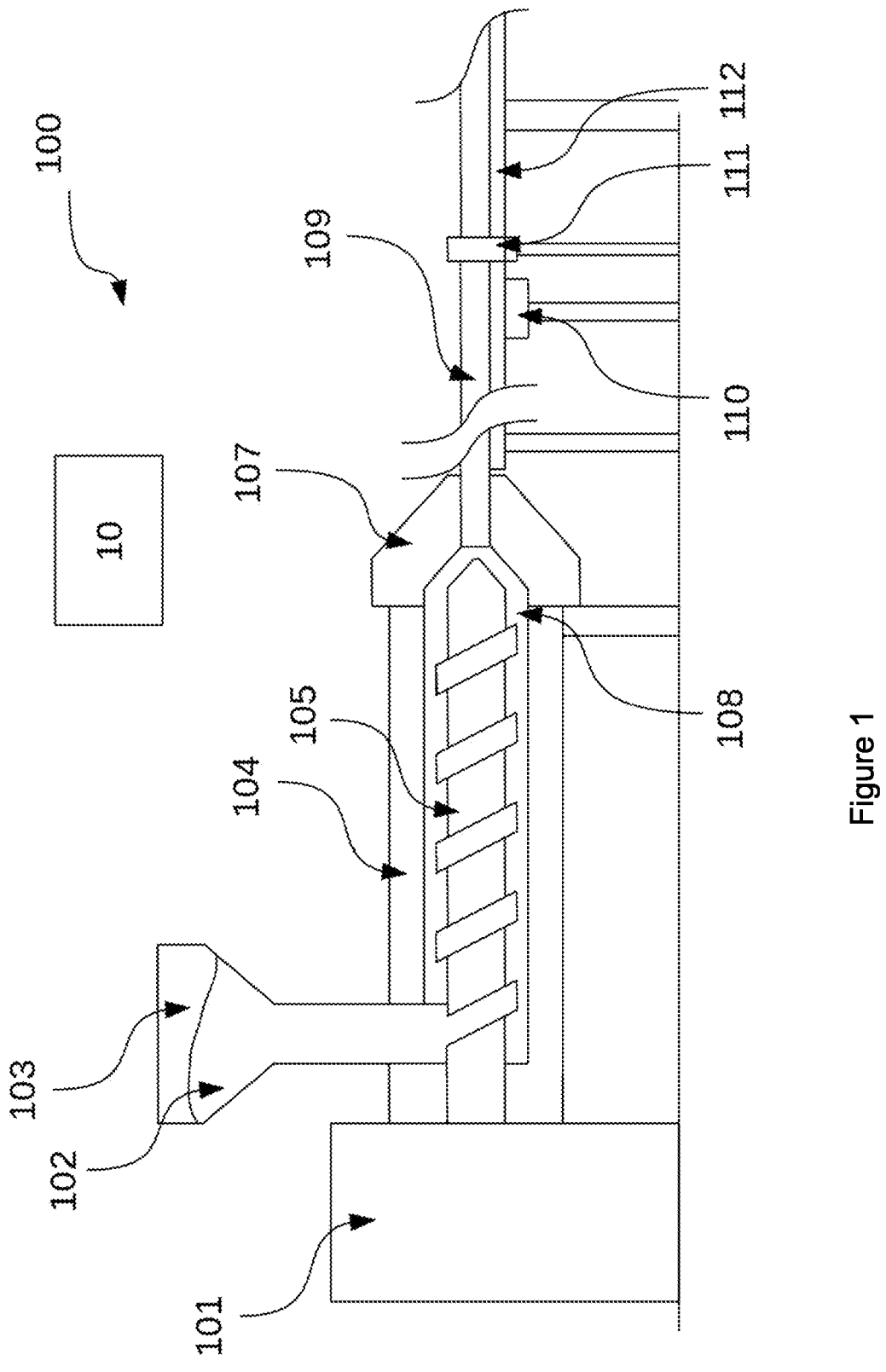
FIG. 1: shows a schematic side view of an extrusion installation having one extrusion head.

Exemplary embodiments of the invention will be elucidated hereinbelow. In the drawings, the same reference signs denote the same or similar features of the respective embodiments.

FIG. 1 shows a simplified schematic side view of an apparatus 10 according to the invention for controlling an extrusion installation 100 having at least one extrusion head for shaping at least one extrudate. The extrusion installation 100 comprises substantially the following components: screw drive 101; screw 105; filling hopper 102; barrel 104; extrusion head 107; weight determining unit 110; profile determining unit 111 and conveying apparatus 112.

Material 103 is fed to the extrusion installation 100 via a hopper 102 and is transported via a screw 105 along a barrel 104 in the direction toward an extrusion head 107. While the material 103 is being transported, it is warmed via heated coatings which have been applied to the barrel 104, so that the material is plasticized. The plasticized material 108 is pressed through flow channels in the extrusion head and out of a shaping opening of the extrusion head 107 onto a conveyor belt 112 in the form of an extrudate 109.

The weight determining unit 110 is provided to determine an extrudate weight of the at least one warm extrudate as the weight per unit length, in particular as the weight per meter. The weight determining unit 110 is arranged on an outlet side of the extrusion head at a distance of 75 cm from the outlet side of the extrusion head. A scale is provided as the weight determining unit.

After shaping of the extrudate 109, the extrudate is in a warm state and has an extrudate profile that is characteristic of the warm state. The profile determining unit 111 is provided to determine a warm extrudate profile of the extrudate 109, wherein the warm extrudate profile defines geometric data of the extrudate in a warm state. The weight determining unit 110 is arranged between the extrusion head 107 and the profile determining unit 111.

The profile determining unit 111 determines the warm extrudate profile of the at least one extrudate 109 contactlessly via cameras which are arranged above and at the side of the extrudate.

Figure 2:
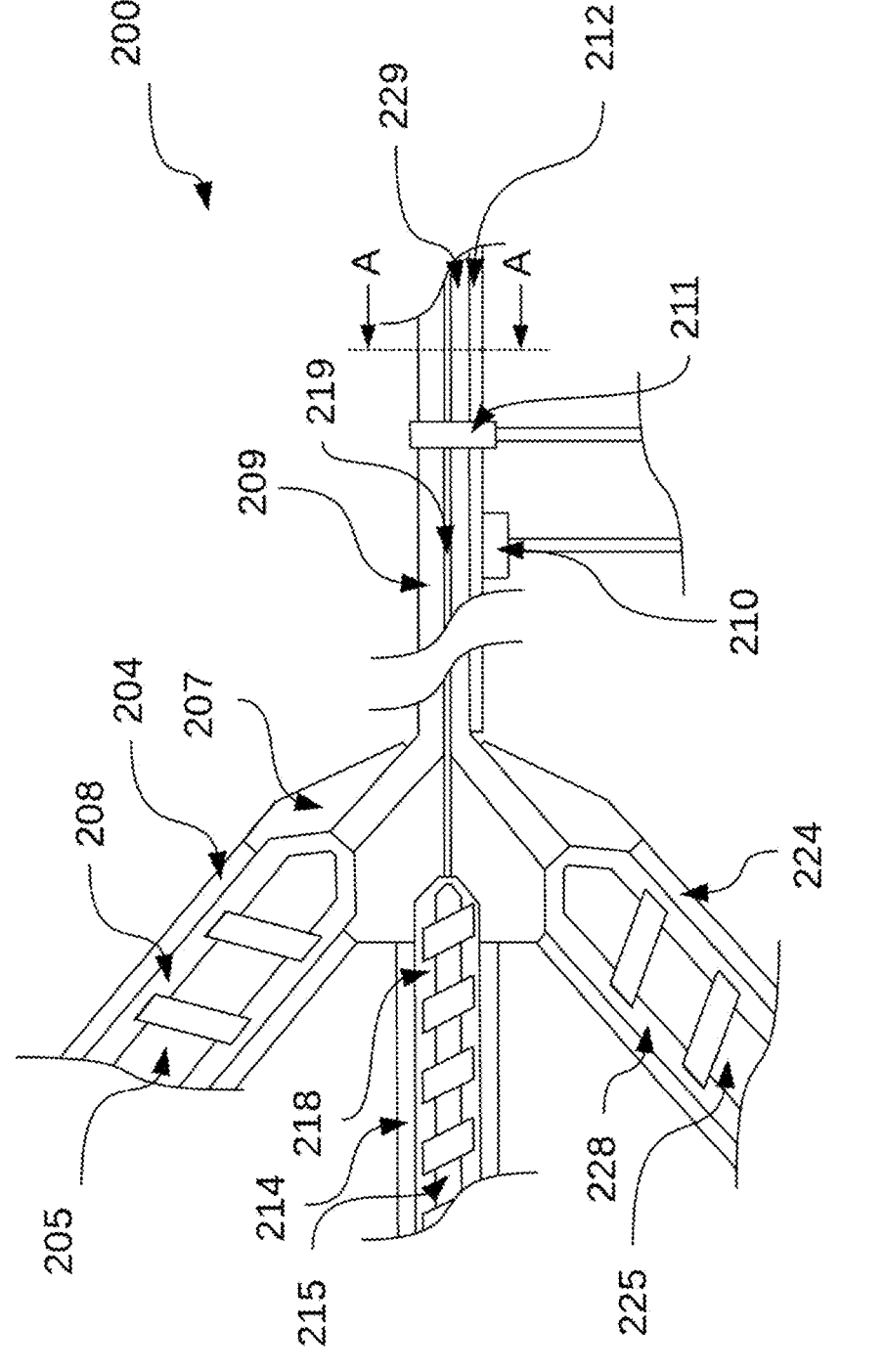
FIG. 2: shows a schematic side view of an extrusion installation having three extrusion heads.

FIG. 2 shows a schematic side view of an extrusion installation 200 according to the invention which has been modified compared to the extrusion installation 100 of FIG. 1 in that, instead of one extrudate 109, three extrudates 209, 219, 229 are produced. It is therefore a multi-extrusion installation. The individual barrels 204, 214, 224 and screws 205, 215, 225 arranged therein are each fed with a different material via a hopper (not shown). The materials are transported via the screws 205, 215, 225 along the barrels 204, 214, 224 in the direction toward a common extrusion head 207. While the material is being transported, it is warmed via heated coatings which have been applied to the barrels 204, 214, 224, so that it is plasticized to form plasticized material 208, 218, 228. The plasticized material 208, 218, 228 is pressed through flow channels in the extrusion head 207 and out of a shaping opening, that is to say via a mold, of the extrusion head 207, onto a conveying apparatus 212 in the form of a common extrudate 239 formed of partial extrudates 209, 219, 229. The conveying apparatus 212 is in the form of a conveyor belt and transports the extrudate 239 further.

Figure 3:
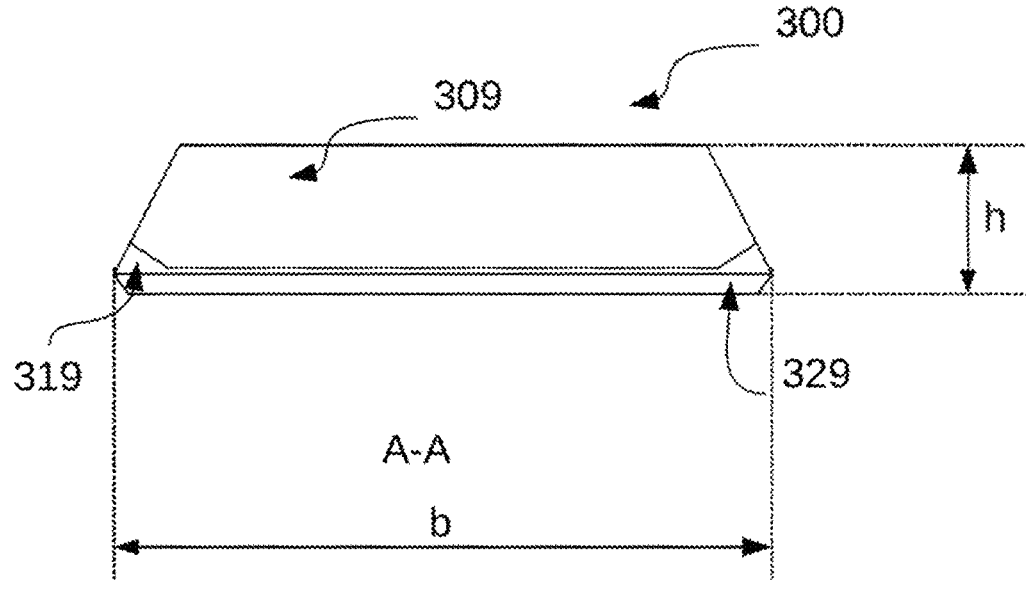
FIG. 3: shows a schematic sectional view of an extrudate which has been produced and which comprises three layers.

FIG. 3 shows in a sectional view A-A a common extrudate 300 consisting of the partial extrudates 309, 319 and 329. The partial extrudates 309, 319 and 329 are arranged in a stacked manner to form the extrudate 300. The extrudate 300 has a partial extrudate 309, which is formed on the partial extrudate 319. The partial extrudate 319 is in turn formed on the partial extrudate 329. The individual partial extrudates 309, 319, 329 can have different thicknesses and arrangements relative to one another, as required. It is conceivable, for example, that the partial extrudate 319 is formed on the partial extrudate 309, which in turn is formed on the partial extrudate 329. It can further be that the partial extrudate 309 has the smallest thickness compared to the partial extrudates 319 and 329. It is further conceivable that the partial extrudates of a common extrudate can be arranged side by side, in an unstacked manner. The partial extrudates can be arranged in any desired manner.

Figure 4:
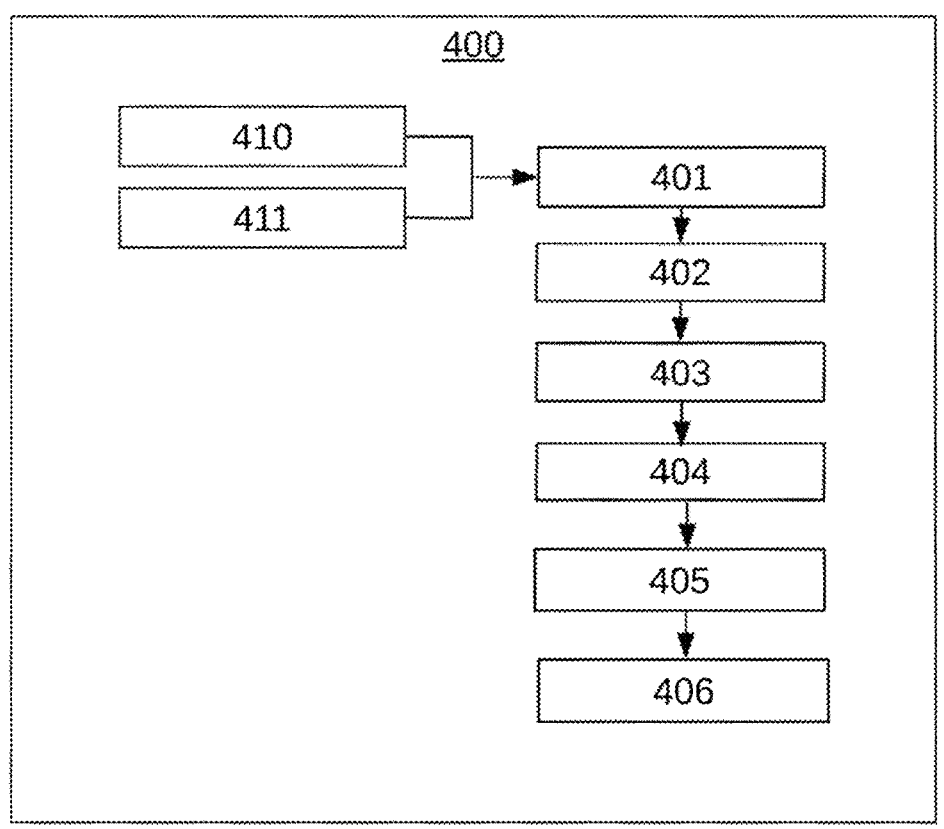
FIG. 4: shows a schematic representation of an apparatus for controlling an extrusion installation having one extrusion head.

FIG. 4 shows a schematic representation of an apparatus 400 according to the invention for controlling an extrusion installation having one extrusion head. The apparatus 400 has the following elements, wherein the apparatus 400 can be used, for example, with the extrusion installation 100 of FIG. 1 or 2 and corresponds to the corresponding apparatus 10: a weight determining unit 410, a profile determining unit 411, a first cold profile modeling unit 402, a comparison unit 403, a parameter determining unit 404, a selecting unit 405 and an actuating unit 406. The individual units are communicatively connected to one another via an EtherCAT connection. Furthermore, in the present embodiment, the first cold profile modeling unit, the second cold profile modeling unit and the warm profile modeling unit are in the form of one modeling unit.

An extrudate 409 is pressed out of an extrusion head and transported further on the conveyor belt. The weight determining unit 410 is provided to determine an extrudate weight of the at least one warm extrudate as the weight per meter. Furthermore, a profile determining unit 411 is provided to determine a warm extrudate profile of the extrudate 409, wherein the warm extrudate profile defines geometric data of the extrudate in a warm state. In the exemplary embodiment shown, the profile determining unit 411 determines the overall height and the overall width of the extrudate.

The first cold profile modeling unit 402 is in communicative connection with the weight determining unit 410 and/or the profile determining unit 411 in order to obtain information about the weight and/or the profile of the extrudate from the weight determining unit 410 and/or the profile determining unit 411. The first cold profile modeling unit 402 further receives information about initial process parameters. The initial process parameters can be read from a storage device which is communicatively connected with the apparatus, for example via a network interface.

The first cold profile modeling unit 402 is provided to parameterize, on the basis of the warm extrudate profile and the initial process parameters, an extrudate model which determines a first cold extrudate profile of the extrudate in a cooled state. In the exemplary embodiment shown, the extrudate model is implemented as a gradient boosting-based method.

In the present embodiment, the extrudate in a warm state has a temperature of 55° C. The extrudate in a warm state has further been measured on the conveyor belt at a distance of 1 m from the outlet side of the extrusion head.

In the present embodiment, the extrudate in a cold state has a temperature of 30° C. The extrudate in a cold state has further been measured, or arranged, on the conveyor belt at a distance of 20 m from the outlet side of the extrusion head.

The first cold profile modeling unit 402 is in communicative connection with the comparison unit 403 in order to transmit the first cold extrudate profile of the extrudate in a cooled state to the comparison unit 403. The comparison unit 403 is configured to determine a first deviation between the first cold extrudate profile and a specified extrudate profile. To this end, the first cold extrudate profile and the specified extrudate profile, in particular the overall height and overall width of the first cold extrudate profile and of the specified extrudate profile, are first compared. These values are compared individually with one another, so that all the geometric values lie within a given specification. In the present embodiment, the first deviation is 1.5% for the overall height and the overall width.

The result of the first deviation between the first cold extrudate profile and a specified extrudate profile is transmitted to a parameter determining unit 404 which is in communicative connection with the comparison unit 403.

The parameter determining unit 404 is configured, using the first deviation, to optimize process parameters and to determine changed process parameters, such that a deviation of a cold extrudate profile that is produced from the specified extrudate profile becomes small.

In the present embodiment, in the case of a deviation that is not small, in particular in the case of a deviation that is greater than a defined threshold value, the parameter determining unit 404 optimizes a rotational speed of the screw. In the present embodiment, the threshold value lies at a deviation of less than 2% of the first simulated cold extrudate profile from the specified extrudate profile.

The parameter determining unit further has a warm profile modeling unit 407 which is configured to determine a simulated warm extrudate profile on the basis of the changed first process parameters, that is to say in the present embodiment the changed rotational speed of the screw, and/or on the warm extrudate profile. To this end, the warm profile modeling unit 407 parameterizes the extrudate model with the changed process parameters.

The warm profile modeling unit 407 transmits information about the simulated warm extrudate profile to a second cold profile modeling unit 408. On the basis of the simulated warm extrudate profile and the changed process parameters, the second cold profile modeling unit 408 determines a second simulated cold extrudate profile.

The second cold profile modeling unit 408 transmits information about the second cold extrudate profile of the extrudate to the comparison unit 403. The comparison unit 403 determines a second deviation between the determined second cold extrudate profile and the specified extrudate profile. In the present case, the overall height and overall width of the second cold extrudate profile and of the specified extrudate profile are compared with one another. In the present embodiment, the second deviation is 1%.

The result of the second deviation is transmitted to the selecting unit 405, which is in communicative connection with the comparison unit 403. The selecting unit 405 selects the changed process parameters as the input for the actuating unit 406 according to the second deviation of 1%, since the second deviation is less than or equal to the threshold value of 1%.

The selecting unit 405 transmits this information about the changed process parameters to the actuating unit 406 as the input. The actuating unit 406 controls the rotational speed of the screw according to the changed process parameters.

If the second deviation were higher than the threshold value, here 1%, then the warm profile modeling unit and the cold profile modeling unit could determine further warm and cold profiles until the parameter determining unit has determined changed process parameters which allow the deviation to fall below the threshold value.

Figure 5:
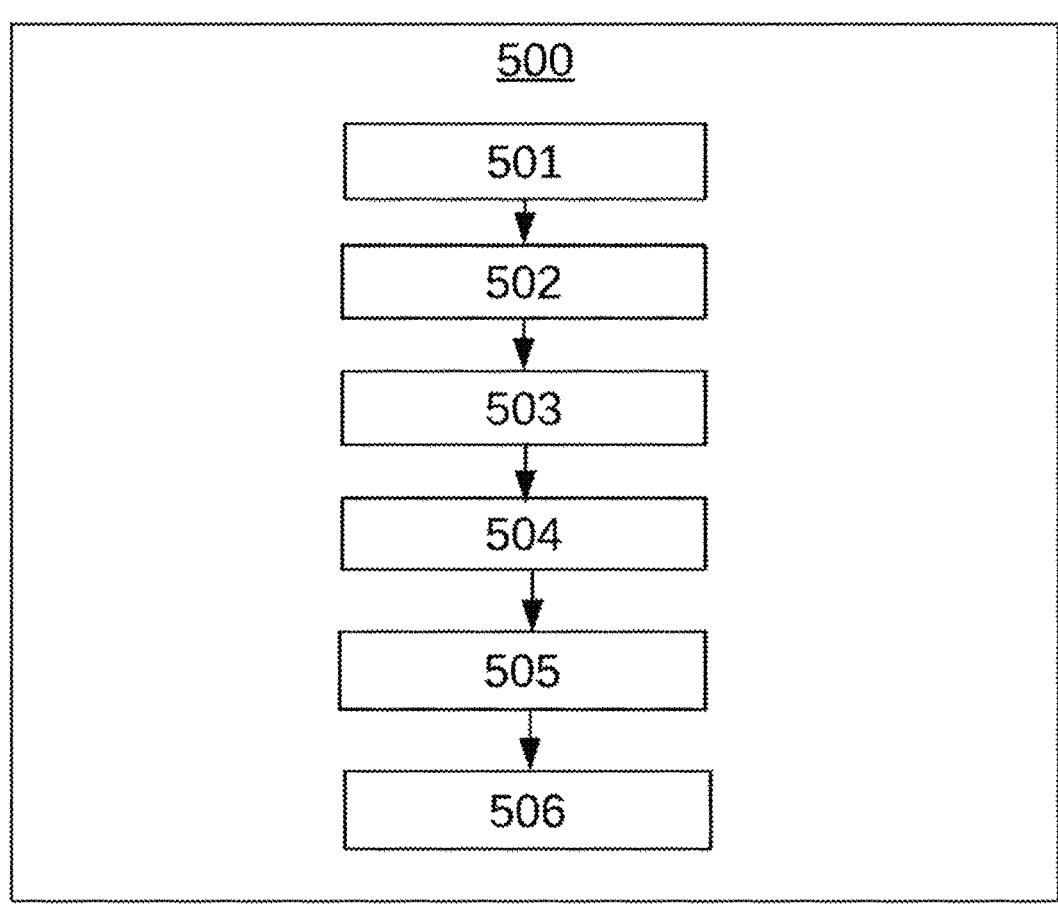
FIG. 5: shows a flow diagram of a method for controlling an extrusion installation.

According to further embodiments, which can be combined with other embodiments described herein, the apparatus described herein can be used in particular using a method described herein for controlling an extrusion installation. FIG. 5 shows a flow diagram of a method 400 according to the invention for controlling an extrusion installation.

The method comprises, in a step 501, the determination of a warm extrudate profile of at least one extrudate by means of a profile determining unit, wherein the warm extrudate profile defines geometric data of the extrudate in a warm state. The method 500 further comprises, in a second step 502, parameterization of an extrudate model by means of a first cold profile modeling unit on the basis of the warm extrudate profile and initial process parameters, wherein the extrudate model determines a first cold extrudate profile of the extrudate in a cooled state. The method further comprises, in a third step 503, the determination of a first deviation between the determined first cold extrudate profile and a specified extrudate profile by means of a comparison unit. A fourth step 504 of the method 500 comprises the optimization of process parameters and the determination of changed process parameters using the first deviation by means of a parameter determining unit, such that a deviation of a cold extrudate profile that is produced from the specified extrudate profile becomes small. The method further comprises, in a fifth step 505, selection of the changed process parameters as the input for an actuating unit of the extrusion installation if the deviation is less than or equal to a threshold value, by means of a selecting unit. A sixth step 506 of the method 500 comprises control of the extrusion installation with the changed process parameters by means of the actuating unit.

LIST OF REFERENCE SIGNS 100 extrusion installation having one extrusion head
10 apparatus for controlling an extrusion installation
101 screw drive
102 filling hopper
103 material for extrusion
104 barrel
105 screw
107 extrusion head
108 plasticized material
109 extrudate
110 weight determining unit
111 profile determining unit
112 conveying apparatus
200 extrusion installation having three extrusion heads
204/214/224 barrel
205/215/225 screw
207 extrusion head
208/218/228 plasticized material
209/219/229 partial extrudate
239 common extrudate
210 weight determining unit
211 profile determining unit
212 conveying apparatus
300 extrudate profile produced by means of the extrusion installation (200)
309/319/329 extrudate
h overall height
b overall width
400 apparatus for controlling an extrusion installation
401 profile determining unit
402 first cold profile modeling unit
403 comparison unit
404 parameter determining unit
405 selecting unit
406 actuating unit
407 warm profile modeling unit
408 second cold profile modeling unit
410 weight determining unit
411 profile determining unit
500 method for controlling an extrusion installation
501 determination of a warm extrudate profile of at least one extrudate
502 parameterization of an extrudate model
503 determination of a first deviation between the determined first cold extrudate profile and a specified extrudate profile
504 optimization of process parameters and determination of changed process parameters
505 selection of the changed process parameters as the input for an actuating unit of the extrusion installation
506 control of the extrusion installation with the changed process parameters

The invention claimed is:

1. An apparatus for controlling an extrusion installation having at least one extrusion head for shaping at least one extrudate, the apparatus comprising:
   a profile determining unit configured to determine a warm extrudate profile of at least one extrudate, wherein the warm extrudate profile defines geometric data of the extrudate in a warm state;
   a first cold-profile modeling unit configured, on the basis of the warm extrudate profile and initial process parameters, to parameterize, using artificial intelligence, an extrudate model which determines a first cold extrudate profile of the extrudate in a cooled state;
   a comparison unit configured to determine a first deviation between the determined first cold extrudate profile and a specified extrudate profile,
   a parameter determining unit configured, using the first deviation, to optimize process parameters and to determine changed process parameters, such that a deviation of a cold extrudate profile dimension that is produced from the specified extrudate profile is less than two percent;
   a selection unit configured to select, during extrusion, the changed process parameters as the input for an actuating unit if the deviation is less than or equal to a threshold value of less than two percent, and
   the actuating unit configured to control the extrusion installation with the changed process parameters in order to produce a second warm extrudate.

2. The apparatus as claimed in claim 1,
wherein the parameter determining further comprises:
   a warm profile modeling unit configured to determine a simulated warm extrudate profile on the basis of the changed process parameters and/or the warm extrudate profile, and
   a second cold profile modeling unit configured to determine a second simulated cold extrudate profile on the basis of the simulated warm extrudate profile and the changed process parameters, wherein the comparison unit is further configured to determine a second deviation between the determined second simulated cold extrudate profile and the specified extrudate profile.

3. The apparatus of claim 1, wherein the apparatus has a weight determining unit for determining a warm extrudate weight of the at least one extrudate on an outlet side of the extrusion head.

4. The apparatus of claim 1, wherein the threshold value is less than 1% of the at least first simulated cold extrudate profile from the specified extrudate profile.

5. The apparatus of claim 1, wherein the profile determining unit is configured to determine a second warm extrudate profile for a second warm extrudate and to compare it with the simulated warm extrudate profile, wherein the second cold profile modeling unit is configured to use the second warm extrudate profile if a deviation between the second warm extrudate profile and the simulated warm extrudate profile is greater than the threshold value, wherein the comparison unit can be configured to determine the deviation.

6. The apparatus of claim 1, wherein the first cold profile modeling unit, the second cold profile modeling unit and/or the warm profile modeling unit are in the form of one modeling unit.

7. The apparatus of claim 1, wherein the extrudate in a warm state (i) has a temperature of more than 60° C., or more than 55° C., or more than 50° C. and/or (ii) is arranged on a conveying apparatus at a distance of less than 40 m, or less than 30 m, or less than 20 m, or less than or equal to 10 m on the outlet side of the extrusion head, and/or the extrudate in a cold state (iii) has a temperature of less than or equal to 50° C., or less than 45° C., or less than 40° C. and/or (iv) is arranged on a conveying apparatus at a distance of more than 80 m, or more than 50 m, or more than 30 m, or more than 10 m on the outlet side of the extrusion head.

8. The apparatus of claim 1, wherein the determination of the cold extrudate profile and/or the determination of the warm extrudate profile is carried out by means of artificial intelligence, wherein the artificial intelligence is a neural network, an LSTM-based system, and/or gradient boosting.

9. The apparatus of claim 1, wherein a memory which is configured to store warm and cold extrudate profiles of extrudates that are produced as well as process parameters, at predefined intervals, wherein the cold profile and/or the warm profile modeling units are configured to train the extrudate model using the stored extrudate profiles.

10. A computer-implemented method for controlling an extrusion installation, comprising:

a) determination of a warm extrudate profile of at least one extrudate by a profile determining unit, wherein the warm extrudate profile defines geometric data of the extrudate in a warm state, b) parameterization, using artificial intelligence, of an extrudate model by a first cold profile modeling unit on the basis of the warm extrudate profile and initial process parameters, wherein the extrudate model determines a first cold extrudate profile of the extrudate in a cooled state, c) determination of a first deviation between the determined first cold extrudate profile and a specified extrudate profile by a comparison unit, d) optimization of process parameters and determination of changed process parameters using the first deviation by a parameter determining unit, such that a deviation of a cold extrudate profile dimension that is produced from the specified extrudate profile is less than two percent, e) selection, during extrusion, of the changed process parameters as the input for an actuating unit of the extrusion installation if the deviation is less than or equal to a threshold value of two percent, by a selecting unit, and f) control of the extrusion installation with the changed process parameters by an actuating unit.

11. The computer-implemented method as claimed in claim 10, wherein the optimization of the process parameters comprises:

determination of a simulated warm extrudate profile on the basis of the changed process parameters and the warm extrudate profile by a warm profile modeling unit, and determination of a second simulated cold profile on the basis of the simulated warm extrudate profile and changed process parameters by a second cold profile modeling unit, wherein the determination comprises a comparison of the second simulated cold extrudate profile with the specified extrudate profile and the determination of a second deviation between the second simulated cold extrudate profile and the specified extrudate profile.

12. The computer-implemented method of claim 10, wherein the optimization of the process parameters comprises:

determination of a second warm extrudate profile for a second warm extrudate, comparison of the second warm extrudate profile with the simulated warm extrudate profile by the comparison unit, use of the second warm extrudate profile in the determination of the cold extrudate profile if a deviation between the second warm extrudate profile and the simulated warm extrudate profile is greater than the threshold value.

13. The apparatus of claim 1, further comprising:

at least one extrusion head;

at least one screw;

at least one screw drive;

at least one barrel;

at least one filling hopper;

at least one material transport unit; and/or at least one cooling unit.

14. The apparatus of claim 1, further comprising a computer readable storage medium which contains instructions for controlling an extrusion installation, the instructions cause at least one processor to:

a) determination of a warm extrudate profile of at least one extrudate by a profile determining unit, wherein the warm extrudate profile defines geometric data of the extrudate in a warm state, b) parameterization, using artificial intelligence, of an extrudate model by a first cold profile modeling unit on the basis of the warm extrudate profile and initial process parameters, wherein the extrudate model determines a first cold extrudate profile of the extrudate in a cooled state, c) determination of a first deviation between the determined first cold extrudate profile and a specified extrudate profile by a comparison unit, d) optimization of process parameters and determination of changed process parameters using the first deviation by a parameter determining unit, such that a deviation of a cold extrudate profile that is produced from the specified extrudate profile is less than two percent, e) selection, during extrusion, of the changed process parameters as the input for an actuating unit of the extrusion installation if the deviation is less than or equal to a threshold value of two percent, by a selecting unit, and f) control of the extrusion installation with the changed process parameters by an actuating unit determination of a simulated warm extrudate profile on the basis of the changed process parameters and the warm extrudate profile by a warm profile modeling unit, and determination of a second simulated cold profile on the basis of the simulated warm extrudate profile and changed process parameters by a second cold profile modeling unit, wherein the determination comprises a comparison of the second simulated cold extrudate profile with the specified extrudate profile and the determination of a second deviation between the second simulated cold extrudate profile and the specified extrudate profile;

determination of a second warm extrudate profile for a second warm extrudate, comparison of the second warm extrudate profile with the simulated warm extrudate profile by the comparison unit, use of the second warm extrudate profile in the determination of the cold extrudate profile if a deviation between the second warm extrudate profile and the simulated warm extrudate profile is greater than the threshold value.

*     *     *     *     *